United States Patent
Rogers et al.

(10) Patent No.: US 6,590,770 B1
(45) Date of Patent: Jul. 8, 2003

(54) SERPENTINE, SLIT FIN HEAT SINK DEVICE

(75) Inventors: C. James Rogers, Racine, WI (US); Gregory G. Hughes, Milwaukee, WI (US); L. Winston Zhang, Kenosha, WI (US); Frank M. Grippe, Kansasville, WI (US); Rifaquat Cheema, Kenosha, WI (US)

(73) Assignee: Modine Manufacturing Company, Racine, WI (US)

( * ) Notice: Subject to any disclaimer, the term of this patent is extended or adjusted under 35 U.S.C. 154(b) by 0 days.

(21) Appl. No.: 10/098,000

(22) Filed: Mar. 14, 2002

(51) Int. Cl.$^7$ ................................................. H05K 7/20
(52) U.S. Cl. ...................... 361/697; 165/80.3; 165/121; 165/185; 257/722; 361/704; 415/178
(58) Field of Search .................. 165/81–82, 80.3–80.4, 165/121–122, 125, 185, 109.1, 154, 916; 62/259.2; 454/184; 257/722; 361/687, 704, 707, 690, 694–697, 703; 415/176–178, 200, 211.2, 213.1

(56) References Cited

U.S. PATENT DOCUMENTS

| | | |
|---|---|---|
| 2,680,009 A | 6/1954 | Nekut |
| 3,180,404 A | 4/1965 | Nelson et. al. |
| 3,187,812 A | 6/1965 | Staver |
| 3,542,124 A | 11/1970 | Manfredo |
| 4,605,058 A | 8/1986 | Wilens |
| 4,753,290 A | 6/1988 | Gabuzda |
| 4,941,530 A | 7/1990 | Crowe |
| 4,944,344 A | 7/1990 | Crowe |
| 5,107,922 A | 4/1992 | So |
| 5,195,576 A | 3/1993 | Hatada et al. |
| 5,251,101 A | 10/1993 | Liu |
| 5,299,632 A | 4/1994 | Lee |
| 5,375,655 A | 12/1994 | Lee |
| 5,421,402 A | 6/1995 | Lin |
| 5,494,098 A | 2/1996 | Morosas |

(List continued on next page.)

OTHER PUBLICATIONS

D. C. Briggs, A. L. London, Nov. 30, 1960, THE HEAT TRANSFER AND FLOW FRICTION CHARACTERISTICS OF FIVE OFFSET RECTANGULAR AND SIX PLAIN TRIANGULAR PLATE–FIN HEAT TRANSFER SURFACES, Technical Report No. 49, Stanfor University –Stanford, CA.

Raj M. Manglik, Arthur E. Bergles, 1995, HEAT TRANSFER AND PRESSURE DROP CORRELATIONS FOR THE RECTANGULAR OFFSET STRIP FIN COMPACT HEAT EXCHANGER, Cincinnati, OH, Experimental Thermal and Fluid Science 1995, New York, NY.

R, Tossi, M. Asheghi, and K. S. Hou, California State University, Long Beach California, EFFECT OF FLUID PROPERTIES ON HEAT TRANSFER IN CHANNELS WITH OFFSET STRIP FINS, Accepted Jul. 1, 1994, Experimental Heat Transfer.

Primary Examiner—Gregory Thompson
(74) Attorney, Agent, or Firm—Wood, Phillips, Katz, Clark & Mortimer

(57) ABSTRACT

A serpentine, slit fin (26) is provided for a heat sink device (10) used for cooling a electronic component (12) having a surface (14) that rejects heat. The heat sink (10) includes a plate (16) having first and second surfaces (18, 20), with the first surface (18) configured to receive heat from the surface (14) of the electronic component (12). The fin (26) is bonded to the second surface and includes a plurality of offset sidewall portions (48). In one form, a fan (22) is spaced above the second surface (20) to direct an impingement airflow (24) towards the second surface (20) substantially perpendicular to the second surface (20), and the serpentine, slit fin (26) underlies the fan (22) and is bonded to the second surface (20).

20 Claims, 7 Drawing Sheets

U.S. PATENT DOCUMENTS

| | | |
|---|---|---|
| 5,518,071 A | 5/1996 | Lee |
| 5,597,034 A | 1/1997 | Barker, III et al. |
| 5,625,229 A * | 4/1997 | Kojima et al. ............... 361/697 |
| 5,653,285 A | 8/1997 | Lee |
| 5,701,951 A * | 12/1997 | Jean ........................... 165/121 |
| 5,706,169 A * | 1/1998 | Yeh ............................ 361/690 |
| 5,791,406 A | 8/1998 | Gönner et al. |
| 5,892,655 A | 4/1999 | Grouell |
| 5,894,882 A | 4/1999 | Kikuchi et al. |
| 6,009,937 A | 1/2000 | Gönner et al. |
| 6,109,341 A | 8/2000 | Kodaira et al. |
| 6,135,200 A | 10/2000 | Okochi et al. |
| 6,199,624 B1 | 3/2001 | Wotring |
| 6,311,766 B1 | 11/2001 | Lin et al. |
| 6,324,061 B1 | 11/2001 | Kinoshita et al. |
| 6,328,529 B1 * | 12/2001 | Yamaguchi et al. ......... 415/178 |
| 6,401,807 B1 * | 1/2002 | Wyler et al. ................. 165/121 |
| 6,371,200 B1 | 4/2002 | Eaton |
| 6,390,188 B1 * | 5/2002 | Chen .......................... 165/185 |

* cited by examiner

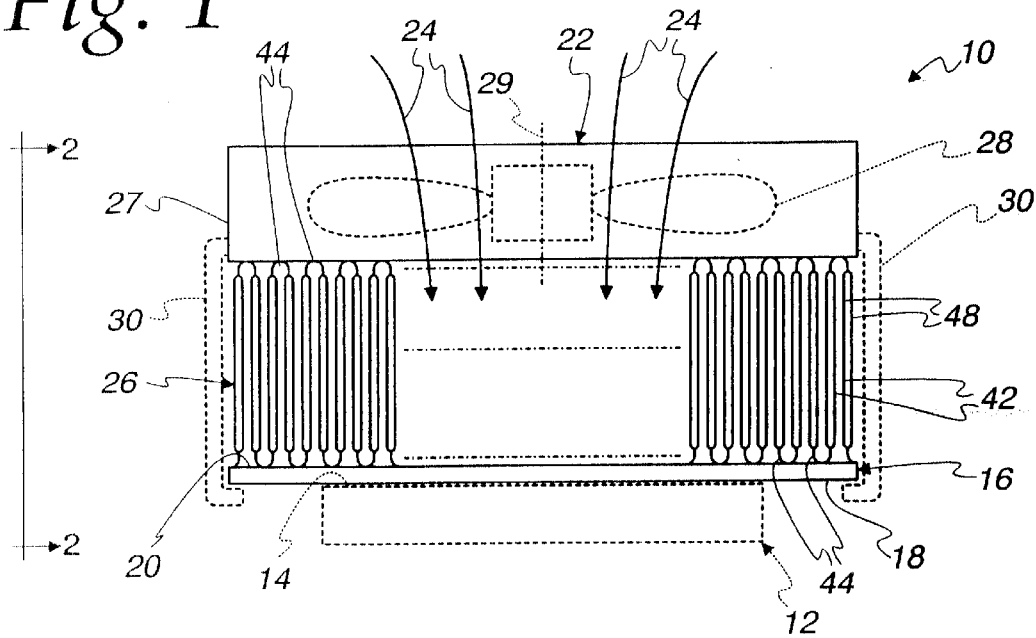
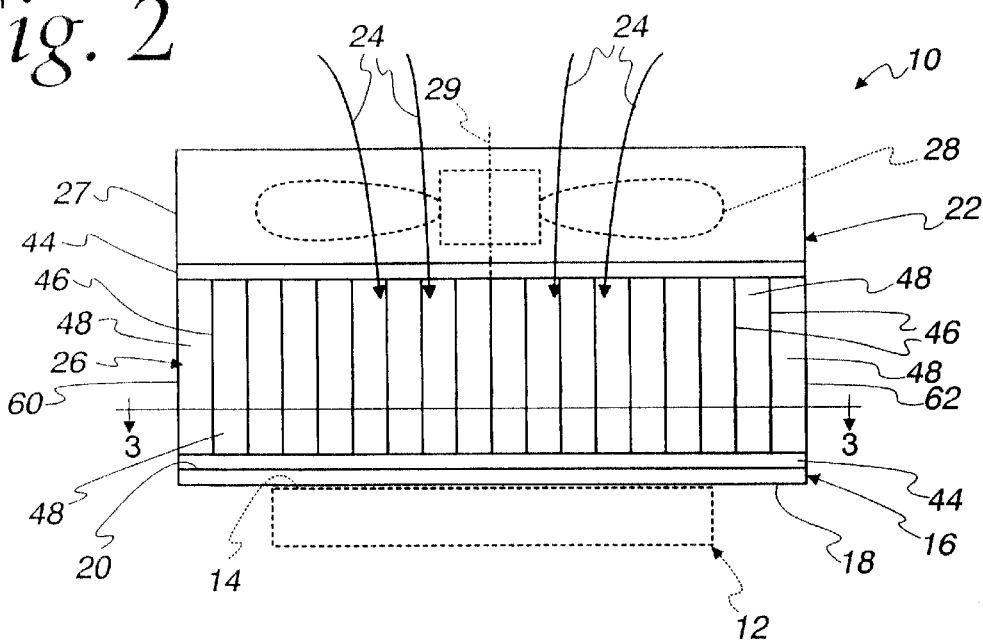
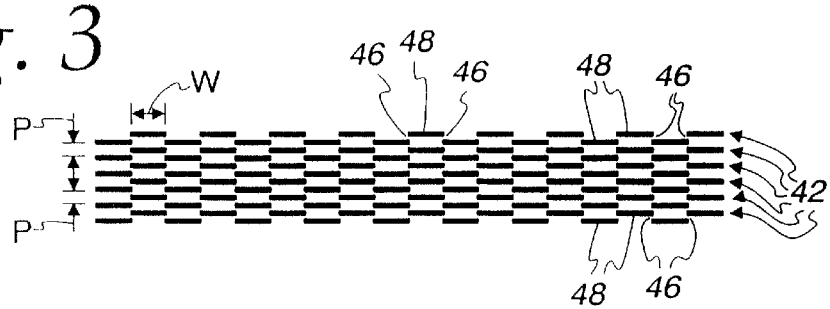

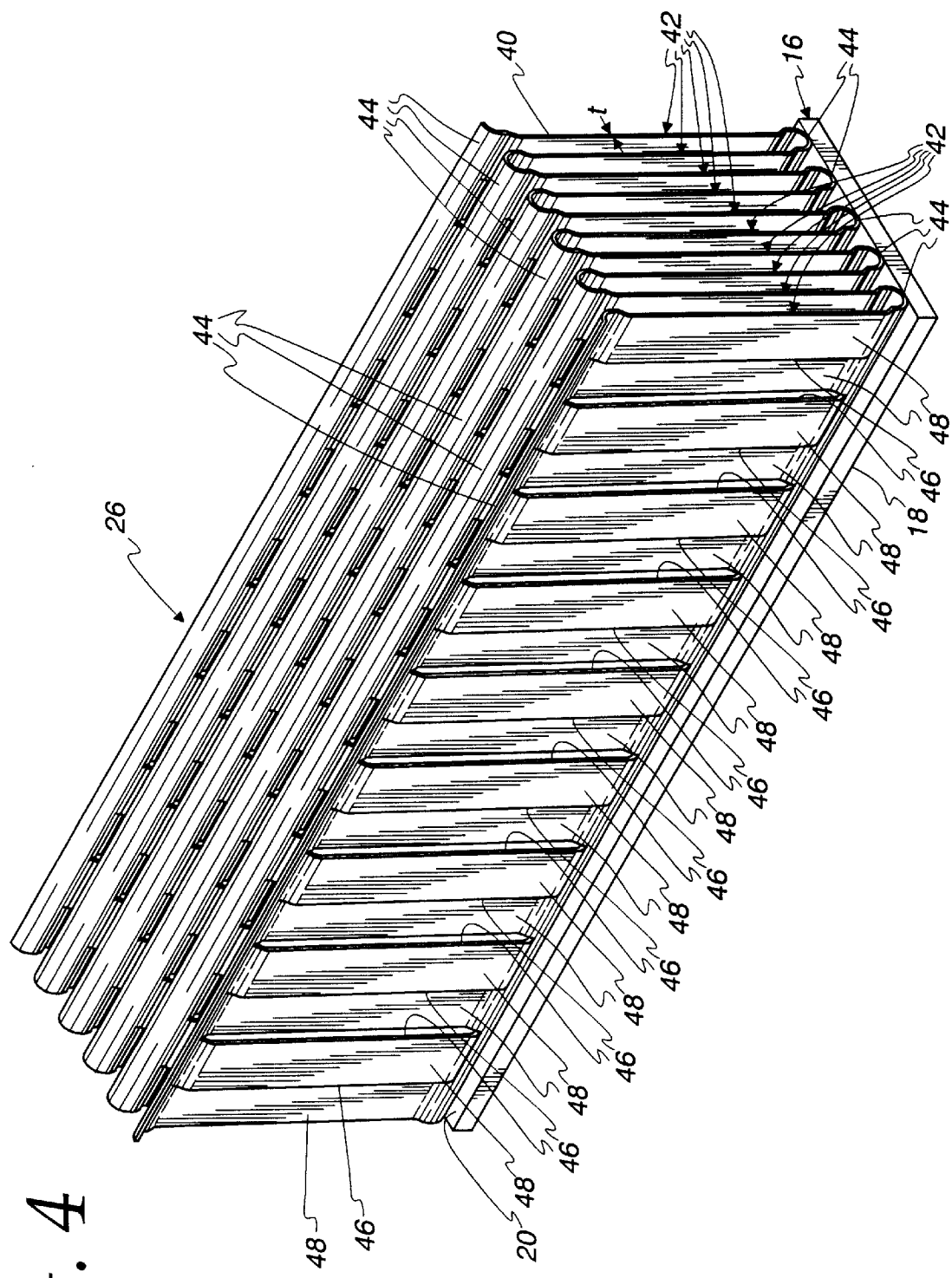

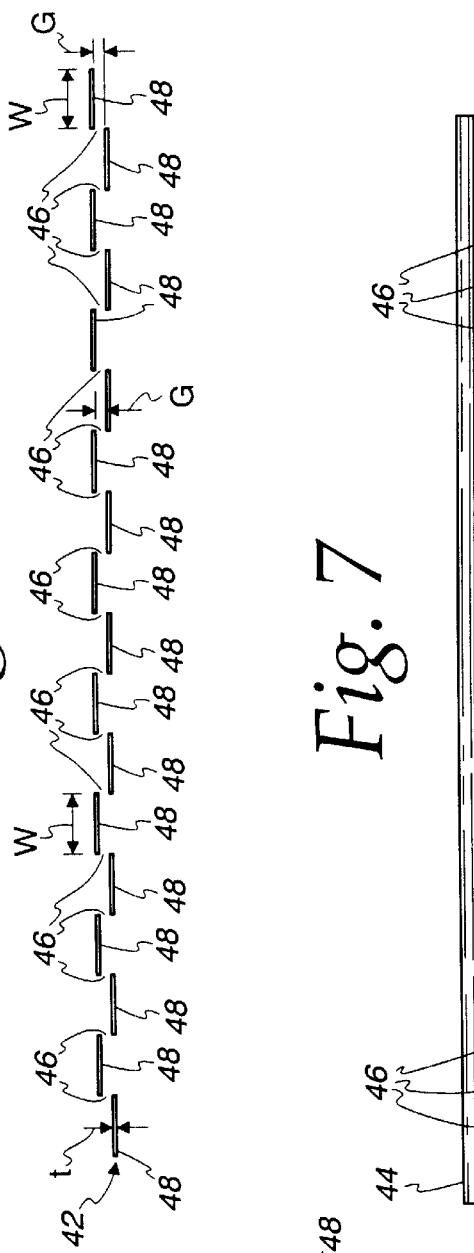
Fig. 5
Fig. 6
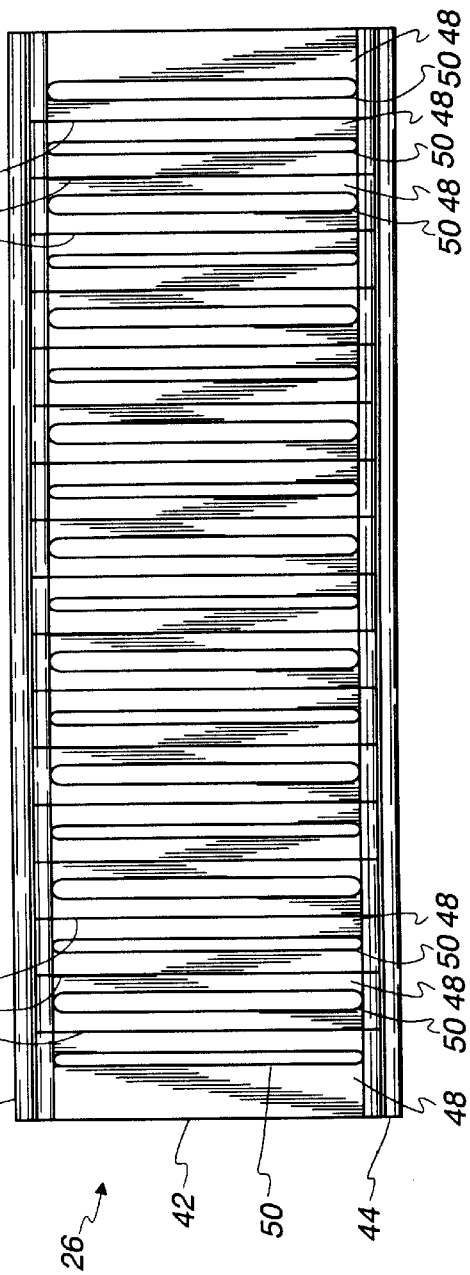
Fig. 7

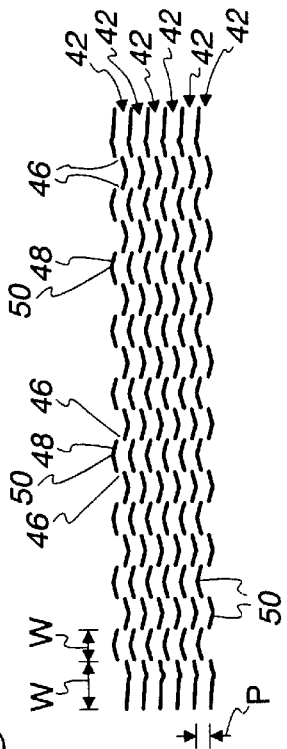
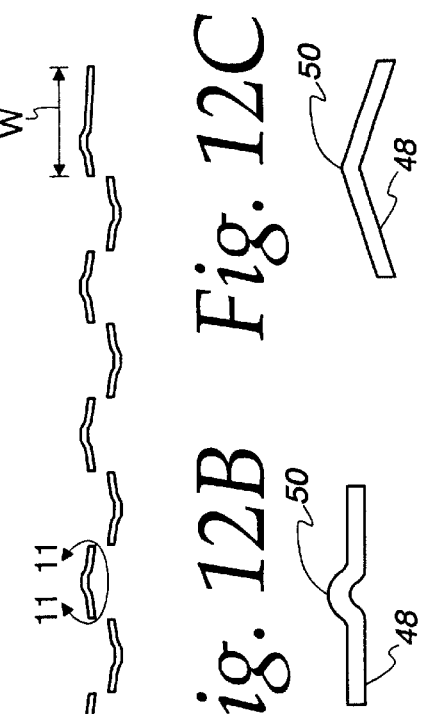
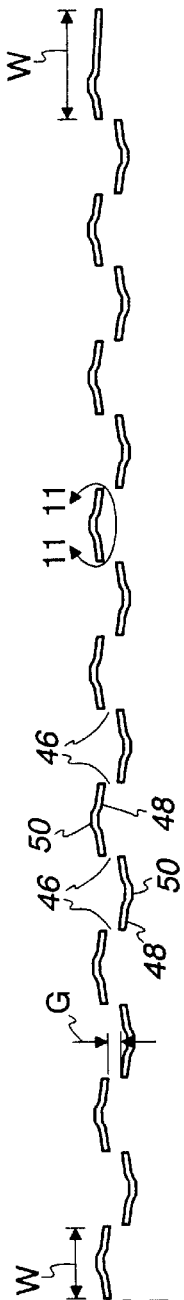
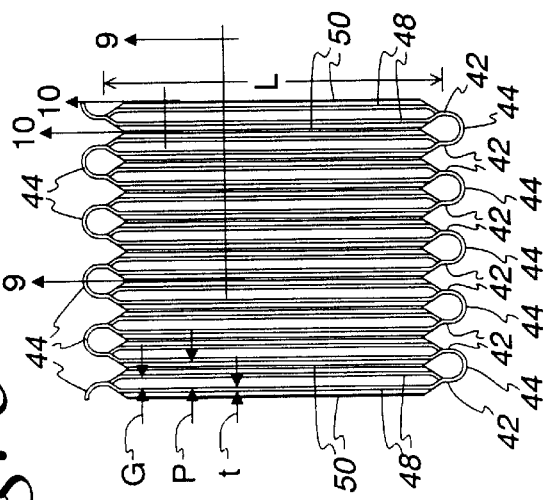
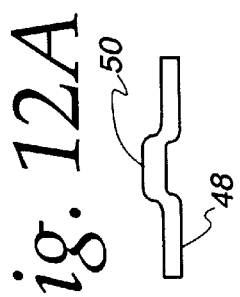

LOUVER-IN
1.000" HIGH, 20° LOUVER ANGLE, 0.055" LOUVER WIDTH,
13.3 FPI & 0.008" THICK

LOUVER-OUT
0.752" HIGH, 27° LOUVER ANGLE, 0.0677" LOUVER WIDTH,
13.3 FPI & 0.010" THICK

SERPENTINE, SLIT FIN HEAT SINK DEVICE

FIELD OF THE INVENTION

This device relates to heat sinks, and more particular to improved fins for heat sink devices that include a fan for cooling an electronic component such as an integrated circuit chip, a CPU chip, a large scale chip package, or a very large scale chip package, especially an impingement airflow fan.

BACKGROUND OF THE INVENTION

Heat sink devices that include a base plate having one surface adapted for receiving heat from an electronic device and another surface for mounting a heat conductive, serpentine fin, and an impingement airflow fan for directing an air flow perpendicular to the surface of the plate on which the fin is mounted are well known. Examples of such heat sink devices are disclosed in U.S. Pat. Nos. 4,753,290, 5,251,101, 5,299,632, 5,494,098, 5,597,034, 6,109,341, and 6,135,200. Heat sink devices are also known that utilize a fan to direct an airflow parallel to the surface of the plate on which the fin is mounted. While at least some of these devices may work well for their intended purpose, there is always room for improvement.

SUMMARY OF THE INVENTION

It is the primary object of the invention to provide a new and improved fin for a heat sink device.

It is another object of the invention to provide a new and improved fin for a heat sink device including an impingement airflow fan.

In one form of the invention, an improvement is provided in a heat sink device for cooling an electronic component having a surface that rejects heat. The heat sink includes a plate having first and second surfaces, with the first surface configured to receive heat from the surface of the electronic component, and a fan spaced above the second surface to direct an air flow towards the second surface substantially perpendicularly to the second surface. The improvement includes a serpentine fin underlying the fan and bonded to the second surface. The fin is formed from a folded sheet of material having a thickness t. The fin includes a plurality of sidewalls extending substantially perpendicular to the second surface and joined to each other by bends formed in the sheet. Spaced slits are provided in each of the sidewalls extending substantially perpendicular to the second surface. Each of the sidewalls has a plurality of offsets sidewall portions, with each offset sidewall portions in the sidewall having a width W extending between a pair of the spaced slits in the sidewall and being offset from any adjacent offset sidewall portion in the sidewall by a gap G. Each of the offset sidewall portions has a length L perpendicular to the gap G.

In one form, the ratio of L/G is in the range of 23 to 100.

According to one aspect, the ratio of L/G is in the range of 30 to 40.

In one form, the offset sidewall portions in each sidewall are spaced from the offset sidewall portions in any adjacent sidewall by a fin pitch spacing p that is substantially equal to (2*G)+t.

In one aspect, the ratio of G/t is in the range of 2 to 6.

In one aspect, the thickness t is in the range of 0.004" to 0.016".

In accordance with one form, the fin has a total height H perpendicular to the second surface and the ratio of L/H is in the range of 0.7 to 0.95.

According to one aspect, the ratio of W/G is in the range of 2.5 to 10.

In one form, at least some of the offset sidewall portions include a rib formed therein extending substantially perpendicular to the second surface, the rib having a length that is at least equal to ½* L. The fin has a total height H perpendicular to the second surface and the ratio of L/H is in the range of 0.7 to 0.95. In one form, H is in the range of 0.75" to 2.75". In one form, G is in the range of 0.019" to 0.039", and in a highly preferred form, G is in the range of 0.022" to 0.030".

According to one aspect of the invention, an improvement is provided in a heat sink device for cooling an electronic component having a surface that rejects heat. The heat sink device includes a plate having first and second surfaces, with the first surface configured to receive heat rejected from the surface of the electronic component. The improvement includes a serpentine fin bonded to the second surface. The fin is formed from a folded sheet of material having a nominal thickness t, and includes a plurality of substantially parallel sidewalls extending substantially perpendicular to the second surface and joined to each other by bends formed in the sheet. Spaced slits are provided in each of the sidewalls extending substantially perpendicular to the second surface, and each sidewall has a plurality of offset sidewall portions, with each offset sidewall portion in the sidewall having a width W extending between a pair of the spaced slits formed in the sidewall and being offset from any adjacent offset sidewall portion in the sidewall by a gap G. The fin has a total height H perpendicular to the second surface, with H being in the range of 2" to 4". Each of the offset sidewall portions has a length L perpendicular to the gap G, and the ratio of L/H is in the range of 0.7 to 0.95. At least some of the offset sidewall portions include a rib formed therein extending substantially perpendicular to the second surface, and each of the ribs has a length that is at. least equal to ½*L. In one form, G is in the range of 0.19" to 0.039", and in a highly preferred form G is in the range of 0.022" to 0.030".

Other objects and advantages will become apparent from the following specification, including the drawings and appended claims.

BRIEF DESCRIPTION OF THE DRAWINGS

FIG. 1 is a side elevation of a heat sink embodying the present invention;

FIG. 2 is a side elevation taken from 2—2 in FIG. 1;

FIG. 3 is a partial section showing selected fin details and taken from line 3—3 in FIG. 2;

FIG. 4 is an enlarged partial perspective view of a serpentine, slit fin utilized in the heat sink of FIG. 1;

FIG. 5 is an end view of the fin in FIG. 4;

FIG. 6 is a partial section view showing certain details of the serpentine, slit fin taken from lines 6—6 in FIG. 5;

FIG. 7 is a side elevation showing a ribbed embodiment of the serpentine, slit fin utilized in the heat sink of FIG. 1;

FIG. 8 is an end view of the fin in FIG. 7;

FIG. 9 is a partial section view in reduced size showing selected fin details and taken from line 9—9 in FIG. 8;

FIG. 10 is a partial section showing selected fin details and taken from line 10—10 in FIG. 8;

FIG. 11 is an enlarged view of the portion encircled by line 11—11 in FIG. 10;

FIGS. 12A, 12B, and 12C show alternate embodiments of the ribbed, slit fin shown in FIGS. 7–11.

DETAILED DESCRIPTION OF THE PREFERRED EMBODIMENTS

Figure 14:
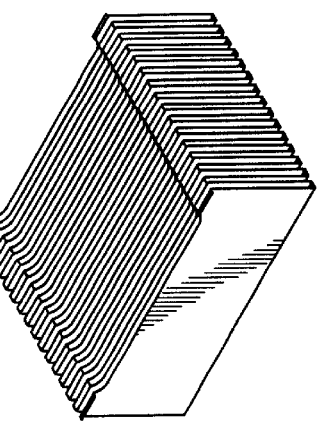
FIGS. 14–17 are drawings illustrating the serpentine fins used for comparison in FIG. 13.

As seen in FIGS. 1 and 2 an impingement airflow heat sink device 10 is provided for cooling an electronic component 12, such as for example an integrated circuit, a CPU chip, a large scale chip package, or a very large scale chip package, having a surface 14 that rejects heat. The heat sink device 10 includes a plate 16 having first and second surfaces 18 and 20 with the surface 18 configured to receive heat rejected from the surface 14 of the electronic component 12; a fan 22 spaced above the second surface 20 to direct an impingement airflow, shown generally by the arrows 24, toward the second surface 20 substantially perpendicular to the second surface 20; and a serpentine, slit fin 26 underlying the fan and bonded to the second surface so as to transfer heat from the plate 16 to the airflow 24 and the environment surrounding the heat sink device 10. It should be understood that the slit fin 26 extends across the entire central portion of the heat sink device 10 in FIG. 1 as indicated by the dashed lines, but is not shown in the central portion for convenience of illustration.

The plate 16 is preferably a one piece construction with the surfaces 18 and 20 being substantially planar and parallel to each other, particularly if the surface 14 of the electronic component 12 is planar. However, it may be advantageous in some applications for at least the surface 18 to have a non-planar configuration if required to conform to a non-planar surface 14 on the electronic component 12. In this regard, the surface 18 will typically be seated against the surface 14 or have a bonding layer or a layer of thermal grease or gel therebetween. However, in some applications it may be desirable to space the surfaces 18 and 14 apart. Further, the plate 16 may serve as a cap or lid for the electronic component 12. Preferably, the plate 16 is made from a suitable heat conducting material, such as aluminum, copper or their alloys.

The fan 22 is preferably a so called "impingement" or "pancake" type fan, many suitable types of which are well-known in the industry. Typically, the fan 22 will include a housing 27 that rotatably mounts a fan impeller 28 driven by an electric motor (not shown) about an axis 29 substantially perpendicular to the surface 20. Preferably, the fan 22, including the impeller 28 and suitable guide surfaces within the housing 27 is configured to distribute the airflow 24 over as large a portion of the slit fin 26 as is possible given the packaging restraints for the heat sink device 10. The fan 22 will typically be attached to the remainder of the heat sink device 10 either by a suitable attachment structure that extends past the slit fin 26 to engage the plate 16, as shown somewhat schematically in phantom at 30, or by bonding the housing 27 of the fan to the slit fin 26 using a suitable bonding technique, such as epoxy bonding. However, in some applications it may be desirable to mount the fan 22 to other structures associated with the electronic component 12, such as a housing that carries the electronic component 12 and the heat sink device 10. In any event, because the mounting of the fan 22 relative to the remainder of the heat sink device 10 is not critical to the understanding or the function of the heat sink device 10 with respect to the slit fin 26, further description of the various means for mounting the fan 22 will not be provided herein.

As best seen in FIGS. 4 and 5, the serpentine slit fin 26 is formed from a folded sheet of material 40 having a nominal thickness t. The fin 26 includes a plurality of substantially parallel sidewalls 42 that extend substantially perpendicular to the surface 20 and are joined to each other by bends 44 formed in the sheet 40. The bends 44 adjacent the surface 20 are bonded to the surface 20 using a suitable bonding technique such as epoxy bonding or brazing. Spaced slits 46 are provided in each the sidewalls 42 and extends substantially perpendicular to the surface 20. Each of the sidewalls 42 includes a plurality of alternating, offset sidewall portions 48, with each of the offset sidewall portions 48 in the sidewall 42 having a width W extending between a pair of the spaced slits 46 in the sidewall 42. Each offset sidewall portion 48 is offset from any adjacent offset sidewall portion 48 in the same sidewall 42 by a gap G, best seen in FIGS. 5 and 6. As best seen in FIG. 5, the slit fin 26 has a total height H, and the offset sidewall portions 48 have a length L, with both the length L and the height H being perpendicular to the gap G. The offset sidewall portions 48 in each sidewall 42 are spaced from the offset sidewall portions 48 in any adjacent sidewall 42 by a fin pitch spacing P that is perpendicular to the length L and parallel to the gap G and the surface 20, as best seen in FIGS. 4 and 5. As is typical for serpentine fins, the fin density is $F_p$ stated in terms of number of fins per unit length (typically fins/inch).

While the particular dimensions for the total height H of the slit fin 26, and the length L of the offset sidewall portions 48 will each be dependent upon the parameters of each specific application, such as for example, the available envelope, the material requirements, and the heat rejection requirements, the ratio of L/H is preferably in the range of about 0.7 to about 0.95 and the height H is in the range of 0.75" to 4.00". In this regard, for embodiments of the fin 26 having a larger total height H, such as a height H that is 2" or greater, it may become desirable to mount the fan 22 so that it provides an airflow parallel to the second surface 20 and to the planes of the sidewalls 42, rather then the impingement airflow configuration shown in FIG. 1. This may be particularly true if the fin height H is 2.75" or greater. In this regard, the fan 22 could be mounted on either of the ends 60 and 62 of the heat sink device 10, rather then above the fin 26.

While the thickness t of the material will be dependent upon the parameters of each specific application, such as for example the material selected, the heat rejection requirements, and manufacturing considerations, in some preferred embodiments, t is in the range of 0.008" to 0.016", particularly when the sheet of material 40 is aluminum or an aluminum alloy. In other preferred embodiments, particularly when the sheet of material 40 is copper or a copper alloy, t is in the range of 0.004" to 0.012". In this regard, the sheet of material 40 can be made of any suitable heat conducting material, such as for example aluminum and copper or their alloys.

While the gap G will depend upon a number of perimeters, such as for example, manufacturing considerations and/or the available airflow and pressure drop of the fan 22, in some preferred embodiments the gap G is in the range of 0.019" to 0.039", and in some highly preferred embodiments, the gap G is in the range of 0.022" to 0.030".

Further, while the fin density $F_p$ can be any suitable value to provide the desired gap G, in some preferred embodiments the fin density $F_p$ is in the range of 11 to 20 fins per inch and in some highly preferred embodiments the fin density is in the range of 13.33 to 16 fins per inch. It should be noted that in some embodiments it may be desirable to employ a relatively high fin density $F_p$ when the material thickness t is relatively thin.

While the ratio of L/G will be highly dependent on the specific parameters of each application, in some preferred embodiments, the ratio of L/G is in the range of 23 to 100 and in some highly preferred embodiments L/G is in the range of 30 to 40. While the fin pitch spacing P can be any suitable value, in some highly preferred embodiments the fin pitch spacing P is substantially equal to (2*G)+t. Similarly, while the ratio of the gap G to the material thickness t can be any suitable value, in some highly preferred embodiments the ratio of G/t is in the range of 2 to 6. Similarly, while the width W will depend upon the specific parameters of each application, such as for example, the heat rejection requirements and manufacturing considerations, in some preferred embodiments the ratio of W/G is in the range of 2.5 to 10, and in some highly preferred embodiments W/G is in the range of 5 to 10.

In one highly preferred embodiment, the fin density $F_p$ is equal to 13.33, the thickness t is equal to 0.0100", the fin height H is equal to 1.000", the length L is equal to 0.890", the gap G is equal to 0.0275", the fin pitch spacing P is equal to 0.065", the ratio of L/G=32.364, and the Width W can be any value from 0.100" to 0.244" but is preferably about 0.150".

In another highly preferred embodiment, the fin pitch $F_p$ is equal to 13.33 fins per inch, the fin height H is equal to 1.000", the length L is equal to 0.890", the gap G is equal to 0.0255", the fin pitch spacing P is equal to 0.063, the thickness t is equal to 0.012", the width W is equal to 0.150", and the ratio of L/G is equal to 34.9.

FIGS. 7–11 show, an alternate embodiment of the slit fin 26 wherein at least some of the offset sidewall portions 48 include an embossed rib 50 that extends perpendicular to the surface 20 and parallel to the length L of the offset sidewall portions 48, and, in the illustrated embodiment, produces a chevron or v-shaped cross section in the associated offset sidewall portions 48. As best seen in FIG. 11, this chevron or v-shaped cross section forms an angle α relative to the plane of the associated sidewall 42 and extends inward by a distant d from the plane of the associated sidewall 42. In some preferred embodiments, the angle α is in the range of 5° to 15° and the depth d is in the range of 0.005" to 0.020", and in highly preferred embodiments the angle α is equal to 10° and the depth d is equal to 0.015". Each of the ribs 50 serves to stiffen the associated offset sidewall portion 48, as well as the associated sidewall 42, and can also serve as a surface enhancement for the associated offset sidewall portion 48, as well as the associated sidewall 42, that increases the heat transfer performance of the fin 26. With respect to the stiffening capabilities of the ribs 50, the greater the height H of the fin 26, the more advantageous the ribs 50 become.

There are a number of possible configurations for the ribs 50. More specifically, the ribs 50 can be embossed so that they protrude in the same direction for each of the offset sidewall portions 48, or as shown in FIGS. 7–11, the ribs 50 can be configured so that they protrude in opposite directions from one offset sidewall portion 48 to the next in each of the sidewalls 42 and in the same direction for the offset sidewall portions 48 that are aligned with each other from sidewall 42 to sidewall 42. Further, it may be desirable in some applications for the ribs 50 to be limited to alternating ones of the offset wall portions 48, or it may be desirable to place the ribs 50 on each of the offset sidewall portions 48 in each the sidewalls 42.

While FIGS. 7–11 show one preferred embodiment of the embossed ribs 50, any suitable shape for the ribs 50 can be employed. For example, FIG. 12A shows a construction where the rib 50 is somewhat semi-rectangular shaped similar to the rib 50 shown in FIGS. 7–11, but does not produce the chevron or v-shaped cross section; FIG. 12B shows a rib 50 having a more semi-circular cross section, again without providing the chevron or v-shaped cross section; and FIG. 12C shows a rib 50 in the form of a rounded apex of the chevron or v-shaped cross section.

Preferably, each of the ribs 50 has a length perpendicular to the second surface that is at least equal to 50% of the length L, and in highly preferred embodiments, is in the range of 70% to a 100% of the length L.

The slits 46 and the offset sidewall portions 48 allow for the impingement airflow 24 to pass through to the underside of the slit fin 26 that is shielded from the airflow 24 by the bends 44 adjacent the fan 22. This allows for the full utilization of the surfaces of the slit fin 26, thereby improving the heat rejection performance of the fin. Additionally, the slits 46 and the offset sidewall portions 48 help to breakup the boundary layers formed by the airflow 24 as it flows over to the surfaces of the slit fin 26, thereby further enhancing the heat rejection performance of the slit fin 26. In this regard, the ribs 50, if employed, can provide additional benefits in breaking up the boundary layers and enhancing the heat rejection performance of the slit fin 26.

Figure 13:
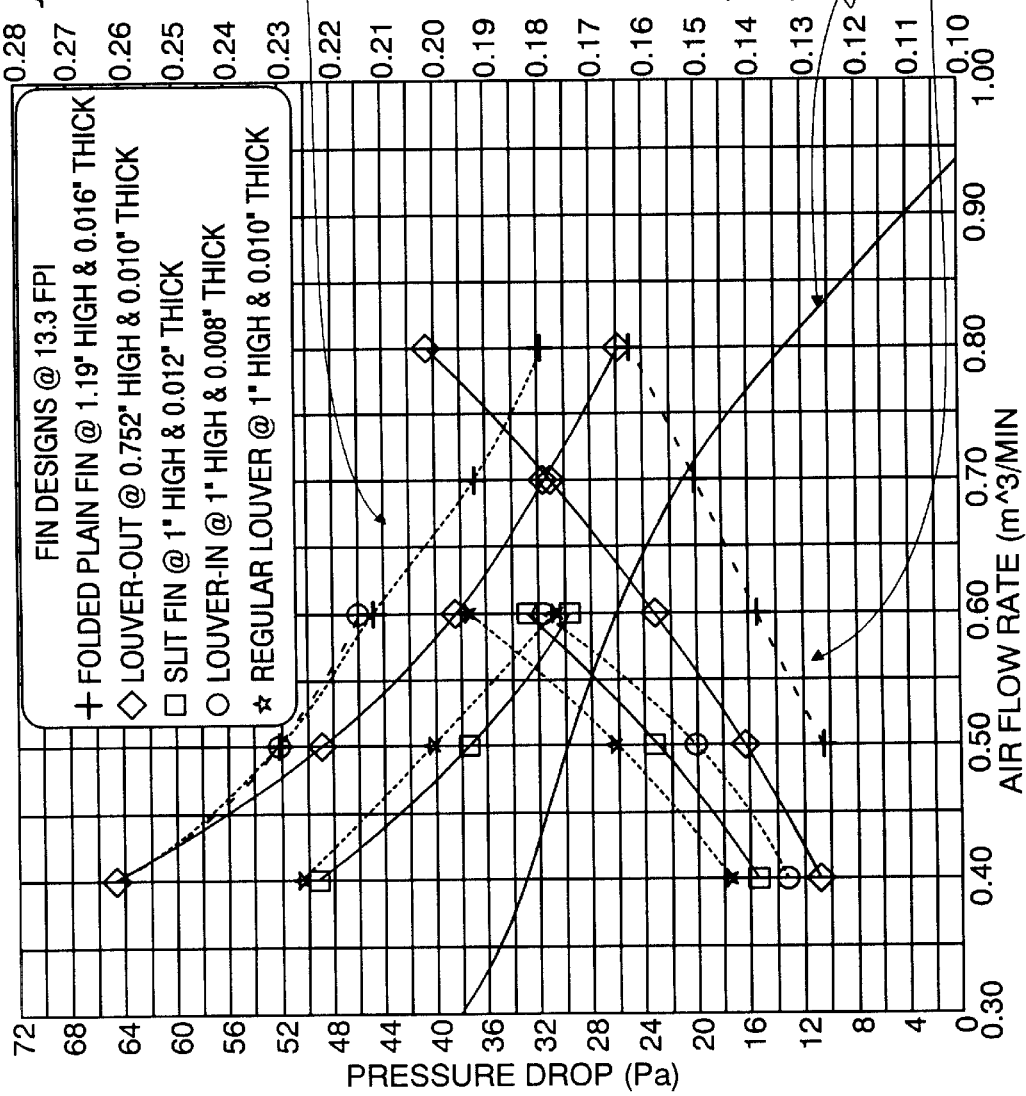
FIG. 13 is a graph comparing certain performance characteristics of a preferred embodiment of the invention with other types of serpentine fins in a impingement airflow heat sink device.
Figure 16:
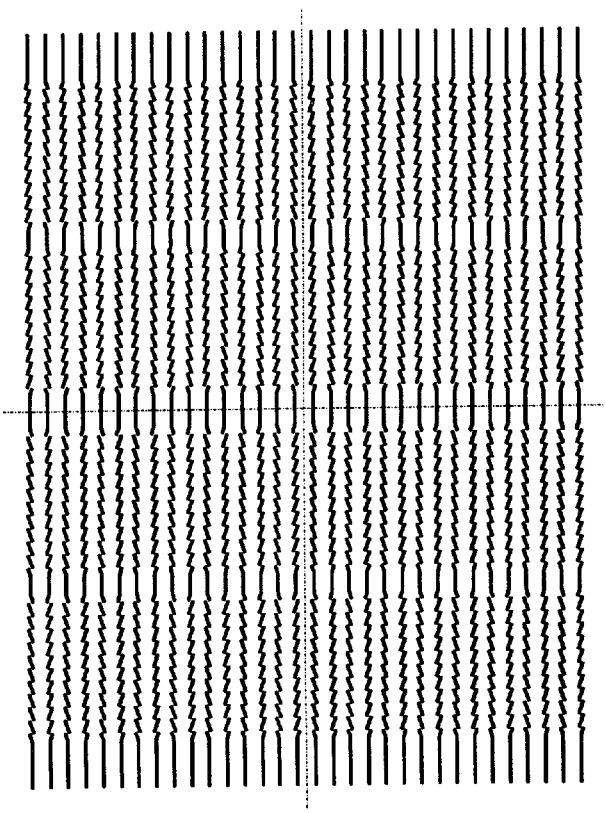
Figure 15:
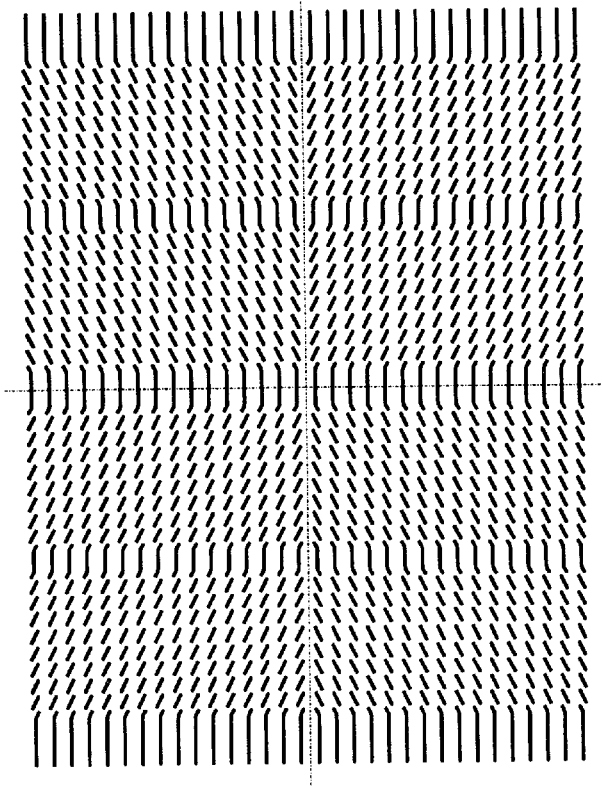
Figure 17:
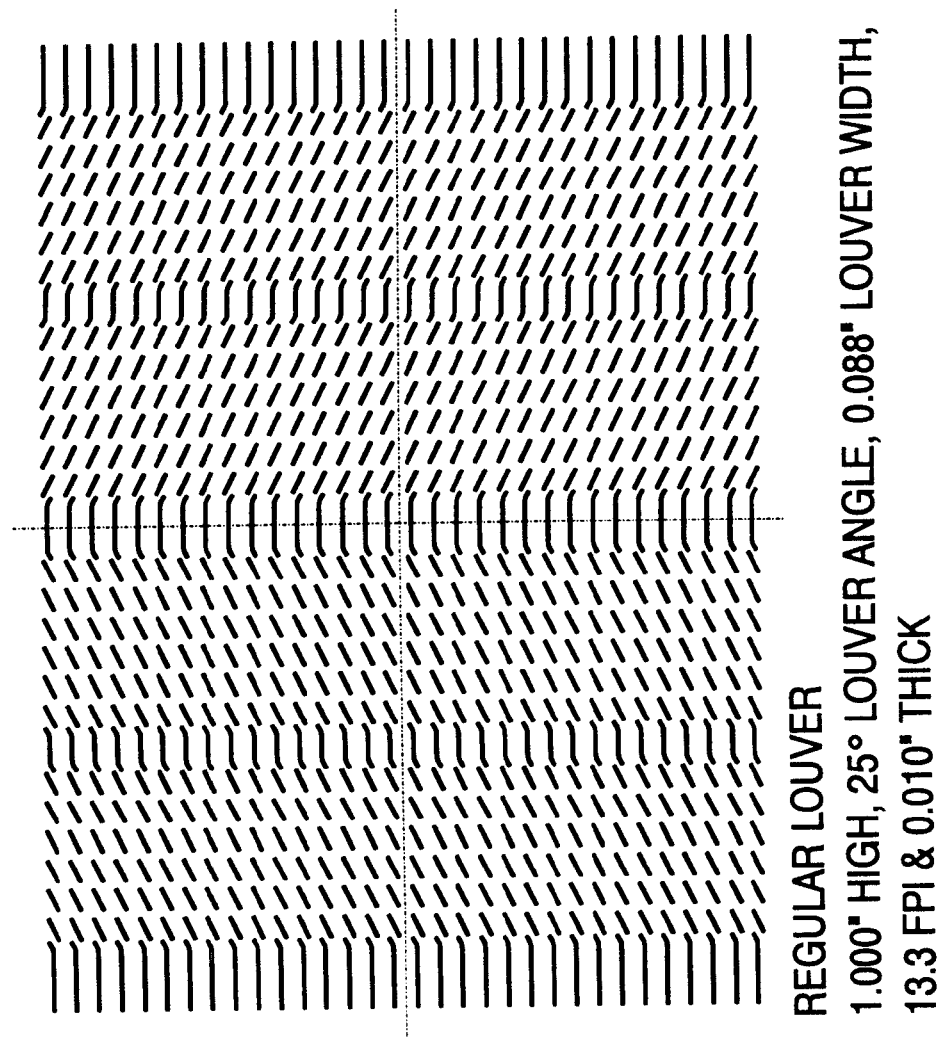

In regard to heat rejection performance, based upon a detailed development project, the slit fin 26 was identified as the highest performing fin for relatively low impingement airflow velocity applications in comparison to other proposed serpentine fins. FIG. 13 shows a graph based upon computer modeling results comparing one preferred embodiment of the slit fin to four other proposed serpentine fins for a particular impingement airflow heat sink application. The graph shows pressure drop in Pascals and thermal resistance in degree Celsius per watt (C/W) versus airflow rate in cubic meters per minute ($m^3$/min). The four alternate serpentine fins are as follows, a plain fin as seen in FIG. 14 that is represented by the + symbol in FIG. 13, a louvered fin represented by the ◊ symbol in FIG. 13 and having the louver pattern shown in FIG. 15, a louvered fin represented by the ○ symbol in FIG. 13 and having the louver pattern shown in FIG. 16, and a louvered fin represented by the ★ symbol in FIG. 13 and having the pattern shown in FIG. 17. The slit fin 26 is represented in the graph by the □ symbol and is configured as shown in FIGS. 7–11 with a fin height H equal to 1", a length L equal to 0.89", a width W equal to 0.150", a thickness t equal to 0.012", a gap G equal to 0.0255", a fin pitch spacing P equal to to 0.063", an angle α equal to 10°, and a depth d equal to 0.015". As seen by the graph in FIG. 13, the thermal resistance of the slit fin 26 is superior to the four other fins considered. More specifically, for a suitable, currently available fan 22, the optimum performance point for each fin can be identified in FIG. 13 as the point where the pressure drop curve for the fin crosses the fan performance curve for the fan 22, which is also shown on FIG. 13. This crossing point establishes the operating airflow rate for each particular fin and the associated thermal resistance for each fin. These thermal resistance are as follows: 0.181 C/W for the slit fin 26, 0.191 C/W for the folded plain fin of FIG. 14, 0.192 C/W for the louvered fin of FIG. 15, 0.219 C/W for the louvered fin of FIG. 16, and 0.195 C/W for the louvered fin of FIG. 17.

What is claimed is:

1. An improvement in a heat sink device for cooling an electronic component having a surface that rejects heat, the heat sink device comprising a plate having first and second surfaces, the first surface configured to receive a heat rejected from the surface of the electronic component, and a fan spaced above the second surface to direct an airflow towards the second surface substantially perpendicular to the second surface; the improvement comprising:

a serpentine fin underlying the fan and bonded to the second surface, the fin formed from a folded sheet of material having a thickness t, the fin comprising a plurality of sidewalls extending substantially perpendicular to the second surface and joined to each other by bends formed in the sheet, spaced slits in each of the sidewalls extending substantially perpendicular to the second surface, each sidewall having a plurality of offset sidewall portions with each offset sidewall portion in the sidewall having a width W extending between a pair of the spaced slits in the sidewall and being offset from any adjacent offset sidewall portion in the sidewall by a gap G, each of the offset sidewall portions having a length L perpendicular to the gap G, the ratio of L/G being in the range of 23 to 100.

2. The fin of claim 1 wherein the offset sidewall portions in each sidewall are spaced from the offset sidewall portions in any adjacent sidewall by a fin pitch spacing P substantially equal to (2*G)+t.

3. The fin of of claim 1 wherein the ratio of G/t is in the range of 2 to 6.

4. The fin of claim 1 wherein t is in the range of 0.004" to 0.016".

5. The fin of claim 1 wherein the fin has a total height H perpendicular to the second surface and the ratio of L/H is in the range of 0.7 to 0.95.

6. The fin of claim 1 wherein the ratio of W/G is in the range of 2.5 to 10.

7. The fin of claim 1 wherein at least some of the offset sidewall portions include a rib formed therein extending substantially perpendicular to the second surface, the rib having a length that is at least equal to ½*L.

8. The fin of claim 1 wherein LUG is in the range of 30 to 40.

9. An improvement in a heat sink device for cooling an electronic component having a surface that rejects heat, the heat sink device comprising: a plate having first and second surfaces, the first surface configured to receive heat rejected from the surface of the electronic component, and a fan spaced above the second surface to direct an airflow towards the second surface substantially perpendicular to the second surface; the improvement comprising:

a serpentine fin underlying the fan and bonded to the second surface, the fin formed from a folded sheet of material having a nominal thickness t, the fin comprising a plurality of substantially parallel sidewalls extending substantially perpendicular to the second surface and joined to each other by bends formed in the sheet, spaced slits in each of the sidewalls extending substantially perpendicular to the second surface, and each sidewall having a plurality of offset sidewall portions with each offset sidewall portion in the sidewall having a width W extending between a pair of the spaced slits formed in the sidewall and being offset from any adjacent offset sidewall portion in the sidewall by a gap G, wherein the fin has a total height H perpendicular to the second surface, each of the offset sidewall portions has a length L perpendicular to the gap G, the ratio of L/H is in the range of 0.7 to 0.95, at least some of the offset sidewall portions include a rib formed therein extending substantially perpendicular to the second surface, and each of the ribs has a length perpendicular to the second surface that is at least equal to ½*L.

10. The fin of claim 9 wherein H is in the range of 0.75" to 2.75".

11. The fin of claim 9 wherein G is in the range of 0.019" to 0.039".

12. The fin of claim 9 wherein G is in the range of 0.022" to 0.030".

13. The fin of claim 9 wherein the offset sidewall portions in each sidewall are spaced from the offset sidewall portions in any adjacent sidewall by a fin pitch spacing P substantially equal to (2*G)+t.

14. The fin of claim 9 wherein the ratio of G/t is in the range of 2 to 6.

15. The heat sink device of claim 9 wherein t is in the range of 0.004" to 0.016".

16. The fin of claim 9 wherein the ratio of W/G is in the range of 2.5 to 10.

17. An improvement in a heat sink device for cooling an electronic component having a surface that rejects heat, the heat sink device comprising a plate having first and second surfaces, the first surface configured to receive heat rejected from the surface of the electronic component; the improvement comprising:

a serpentine fin bonded to the second surface, the fin formed from a folded sheet of material having a nominal thickness t, the fin comprising a plurality of substantially parallel sidewalls extending substantially perpendicular to the second surface and joined to each other by bends formed in the sheet, spaced slits in each of the sidewalls extending substantially perpendicular to the second surface, and each sidewall having a plurality of offset sidewall portions with each offset sidewall portion in the sidewall having a width W extending between a pair of the spaced slits formed in the sidewall and being offset from any adjacent offset sidewall portion in the sidewall by a gap G, wherein the fin has a total height H perpendicular to the second surface, the height H being in the range of 2" to 4", each of the offset sidewall portions has a length L perpendicular to the gap G, the ratio of L/H is in the range of 0.7 to 0.95, at least some of the offset sidewall portions including a rib formed therein extending substantially perpendicular to the second surface, and each of the ribs has a length perpendicular to the second surface that is at least equal to ½*L.

18. The fin of claim 17 wherein G is in the range of 0.019" to 0.039".

19. The fin of claim 17 wherein G is in the range of 0.022" to 0.030".

20. The fin of claim 17 wherein t is in the range of 0.004" to 0.016".

* * * * *